US006766258B1

(12) United States Patent
Stewart et al.

(10) Patent No.: US 6,766,258 B1
(45) Date of Patent: Jul. 20, 2004

(54) METHOD AND APPARATUS FOR DYNAMICALLY ENABLING TRACE DATA COLLECTION

(75) Inventors: Edward C. Stewart, Buda, TX (US); Susan Hickey, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 97 days.

(21) Appl. No.: 10/160,933

(22) Filed: May 31, 2002

(51) Int. Cl.[7] .............................................. G01B 5/28
(52) U.S. Cl. .................. 702/35; 702/35; 702/34; 702/177; 702/185; 702/189; 700/174; 700/178; 73/865.9; 340/680; 318/565
(58) Field of Search ................... 702/33–36, 176–178, 702/185, 189, FOR 124, 125, 141–143, 154, 163, 169; 73/865.9; 340/680; 700/173–175, 178; 318/565

(56) References Cited

U.S. PATENT DOCUMENTS 4,559,600 A * 12/1985 Rao ........................... 364/474
6,266,132 B1 * 7/2001 Stewart et al. ............... 355/69
6,512,991 B1 * 1/2003 Davis et al. ................ 702/136
2002/0177245 A1 * 11/2002 Sonderman et al. .......... 438/14

OTHER PUBLICATIONS

Haiyun et al., "An On–Line Measuring Method of Workpiece Diameter Based on the Principle of 3–Sensor Error Separation", Jan. 1990, IEEE, pp. 1308–1312.*

* cited by examiner

Primary Examiner—Marc S. Hoff
Assistant Examiner—Elias Desta
(74) Attorney, Agent, or Firm—Williams, Morgan & Amerson

(57) ABSTRACT

A method includes identifying a degraded condition associated with the processing of a workpiece. At least one process tool associated with the degraded condition is identified. Trace data collection is enabled for the identified process tool. A system includes a processing system configured to process a workpiece and a tool monitor. The tool monitor is configured to identify a degraded condition associated with the processing of the workpiece, identify at least one process tool from the processing system associated with the degraded condition, and enable trace data collection for the identified process tool.

37 Claims, 3 Drawing Sheets

METHOD AND APPARATUS FOR DYNAMICALLY ENABLING TRACE DATA COLLECTION

BACKGROUND OF THE INVENTION

1. Field of the Invention

This invention relates generally to the field of semiconductor device manufacturing and, more particularly, to a method and apparatus for dynamically enabling trace data collection.

2. Description of the Related Art

There is a constant drive in the semiconductor industry to increase the quality, reliability, and throughput of integrated circuit devices such as microprocessors, memory devices and the like. This drive is fueled by consumer demands for higher quality computers and electronic devices that operate more reliably.

These demands by the consumer have resulted in some improvements in the manufacture of semiconductor devices as well as in the manufacture of integrated circuit devices incorporating such semiconductor devices. Reducing the defects in the manufacture of these devices lowers the cost of the devices themselves. Accordingly, the cost of the final product incorporating these devices is also reduced, thus providing inherent monetary benefits to both the consumer and manufacturer.

The semiconductor manufacturing processes have become more reliable and robust over the past few years. In fact, today's semiconductor manufacturing processes may include an intricate network of multiple process tools for manufacturing semiconductor devices. While the benefits of linking multiple process tools are inherently obvious, there can, however, be some drawbacks, particularly from the standpoint of troubleshooting problems or faults. That is, determining the source of a fault that occurs during the semiconductor manufacturing process may prove to be challenging, as the fault may have occurred in any one of the several process tools that operate on the semiconductor device along the way. Failing to identify the source of the problem expeditiously may naturally delay any potential corrective measures that can be taken to address the problem. Because of these delays, the operation of the semiconductor manufacturing process may be adversely affected, thereby resulting in a potential increase in costs for the manufacturer and consumer.

One technique for identifying the behavior of a process tool involves collecting tool trace data during a processing run of the tool. The particular tool trace information collected depends on the specific process performed by the process tool. For example, exemplary tool trace data for an etch tool may include gas flow, chamber pressure, chamber temperature, voltage, reflected power, backside helium pressure, RF tuning parameters, etc. The tool trace data may also include data external to the process tool, such as ambient temperature, humidity, pressure, etc. Based on the tool state trace data collected, a monitoring device may evaluate the overall health of the process tool. One technique for monitoring the health of the process tool 120 involves employing a multivariate tool health model adapted to predict the expected operating parameters of the process tool during the processing run. If the actual observed tool parameters are close to the predicted tool parameters, the process tool is said to have a high health metric (i.e., the process tool is operating as expected). As the gap between the expected tool parameters and the observed tool parameters widens, the tool health metric decreases. For example, the tool health metric may be expressed as a percentage, with a 100% tool health value equating to a perfect match between the expected tool parameters and the observed tool parameters.

Typically, the tool health model used to predict the operating parameters of the process tool, thereby measuring the health of the process tool, is based on the particular process tool and the base operating recipe employed by the process tool for processing the wafers. Hence, the process tool may have a separate tool health model for each of the base operating recipes run on the process tool. An exemplary tool health monitor software application is ModelWare™ offered by Triant, Inc. of Nanaimo, British Columbia, Canada Vancouver, Canada. An exemplary system for monitoring tool health is described in U.S. patent application Ser. No. 09/863,822, entitled "METHOD AND APPARATUS FOR MONITORING TOOL HEATH," filed in the names of Elfido Coss Jr., Richard J. Markle, and Patrick M. Cowan, that is assigned to, the assignee of the present application and incorporated herein by reference in its entirety.

One limitation of a tool health monitoring technique is the extensive level of resources required to collect and process the data. The volume of data collected for the tool health analysis consumes significant storage resources. Also, the processing resources required to perform the analysis is significant. Wide-scale tool health monitoring may significantly tax the storage and processing bandwidth of the factory management system.

The present invention is directed to overcoming, or at least reducing the effects of, one or more of the problems set forth above.

SUMMARY OF THE INVENTION

One aspect of the present invention is seen in a method including identifing a degraded condition associated with the processing of a workpiece. At least one process tool associated with the degraded condition is identified. Trace data collection is enabled for the identified process tool.

Another aspect of the present invention is seen in a system including a processing system configured to process a workpiece and a tool monitor. The tool monitor is configured to identify a degraded condition associated with the processing of the workpiece, identify at least one process tool from the processing system associated with the degraded condition, and enable trace data collection for the identified process tool.

BRIEF DESCRIPTION OF THE DRAWINGS

The invention may be understood by reference to the following description taken in conjunction with the accompanying drawings, in which like reference numerals identify like elements, and in which.

Figure 1:
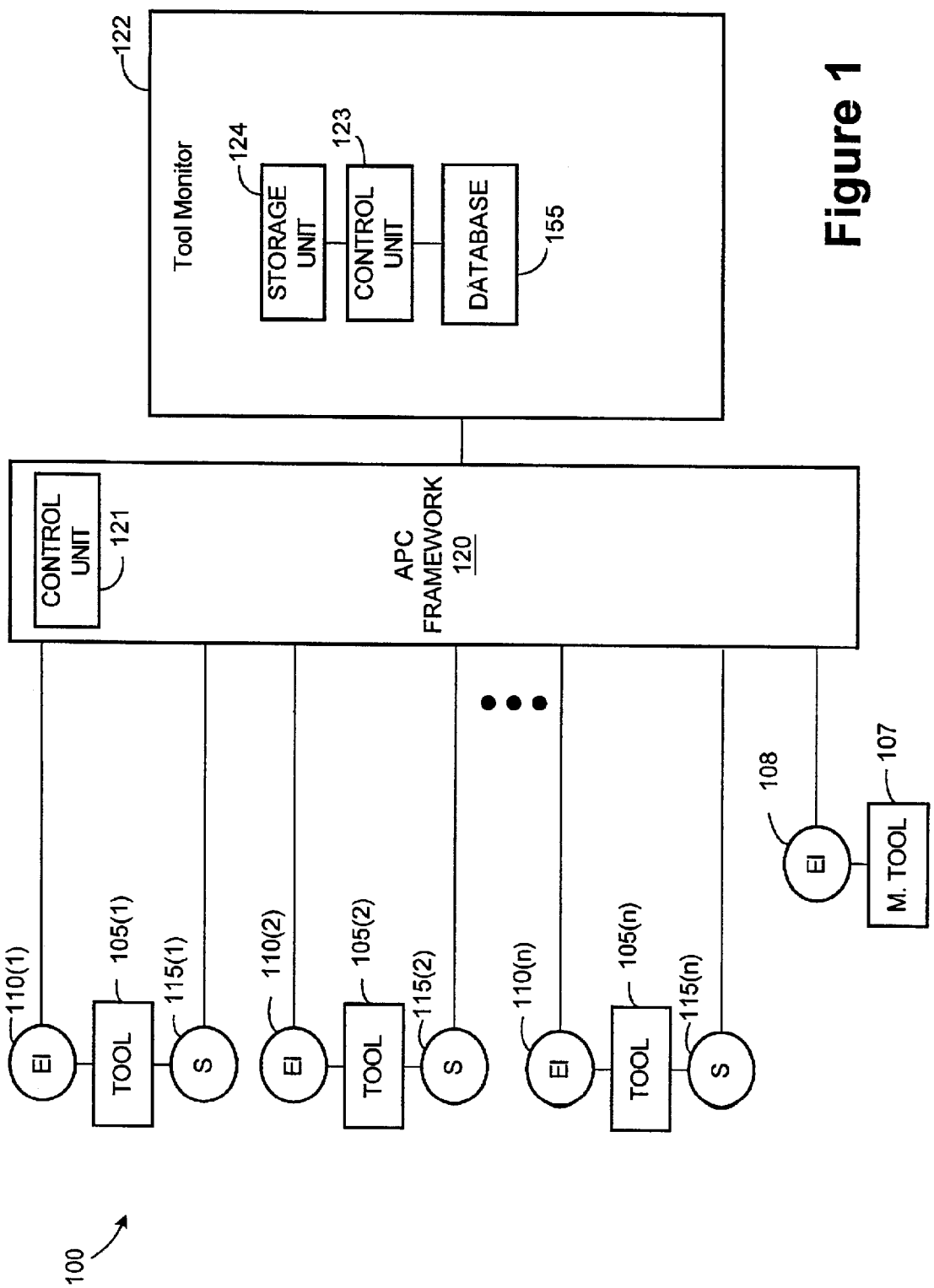
FIG. 1 illustrates a simplified diagram of a manufacturing system, including an APC framework, in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and specifically referring to FIG. 1, a block diagram of a manufacturing system 100 is illustrated in accordance with one embodiment of the present invention. The system 100 includes a plurality of process tools 105 (shown as tools 105(1-n) in FIG. 1). The process tools 105 in the illustrated embodiment may be in the form of semiconductor fabrication equipment used to produce and process semiconductor material, such as silicon wafers. It will be appreciated, however, that the process tools 105 need not necessarily be limited to the production of silicon wafers, but could include other types of manufacturing equipment for producing a variety of different types of commercial products without departing from the spirit and scope of the present invention.

In one embodiment, the process tools 105 may be downstream to each other (e.g., the second process tool 105(2) may be downstream to the first process tool 105(1), the third process tool 105(3) may be downstream to the second process tool 105(2), and so forth). As such, a group of workpieces (hereinafter referred to as a "lot of wafers") that are processed by the first process tool 105(1) may, for example, be provided to the second process tool 105(2), which may further process the lot of wafers before it is processed by the next process tool 105(3). This process may continue until the last process tool 105(n) has completed processing the lot of wafers. In one embodiment, the process tools 105 may include one or more chambers (not shown) where each chamber may perform any one or more of the desired processing steps.

The process tools 105 of the system 100, in one embodiment, may perform various processing steps to create a packaged semiconductor device. For example, the process tools 105 may be used for manufacturing the raw semiconductor material, slicing the semiconductor crystal ingot into individual wafers, fabricating (e.g., etching, doping, ion implanting) the wafers and testing and packaging the completed semiconductor devices. The number of process tools 105 employed in the system 100 may be implementation specific, and thus may vary from one embodiment to another depending on the particular processing steps desired. For the purposes of this discussion, the term "process tool" refers to a tool that is capable of performing one or more processing steps, including a metrology tool for testing and measuring devices. Thus, in a multi-chambered process tool 105, each chamber may represent a "process tool."

Generally, the process tools 105 perform selected processing steps in accordance with an operating recipe defined for each particular process tool 105. In one embodiment, the process tool 105 may have more than one recipe associated therewith. For example, a process tool 105 having multiple chambers may employ multiple recipes, one for each chamber.

In the illustrated embodiment, the manufacturing system 100 includes a metrology tool 107 that is adapted to provide metrology data through an equipment interface 108 based on the lot of wafers received by the metrology tool 107. The metrology tool 107 may measure a variety of parameters related to the wafers that have been processed by the process tools 105. For example, the metrology tool 107 may measure critical dimensions, layer-to-layer overlay, film thickness, and the like. As described in more detail below, based on the metrology data, one or more degraded conditions may be determined in the process tools 105. The degraded condition may be indicative of a fault in one of the process tools 105.

In the illustrated embodiment, the process tools 105 are coupled to respective equipment interfaces (EI) 110 (shown as EI 110(1-n) in FIG. 1). Each equipment interface 110 retrieves various operational data from its respective process tool 105, and communicates this data to an Advanced Process Control (APC) framework 120. Each equipment interface 110 may further receive control signals from the APC framework 120 that may be used to control the respective process tool 105. For example, as explained more fully below, a control signal from the APC framework 120 may be used to cause the equipment interface 110(1) to diagnose the source or cause of the degraded condition within the process tool 105(1) associated with that equipment interface 110(1).

Generally, each equipment interface 110 is designed to interface with its respective process tool 105. As described in more detail below, one or more embodiments of the present invention distribute the task of analyzing and debugging degraded conditions that occur in the process tool 105 to the equipment interface 110 associated with that process tool 105. Because the equipment interface 110 is typically designed to interface with a particular process tool 105, the equipment interface 110 may be better equipped in some instances to analyze and debug error conditions for that particular process tool 105.

The APC framework 120 may be any one of a variety of arrangements that facilitates communications to and from the process tools 105. In one embodiment, the APC framework 120 may include a control unit 121 that manages the communications to and from the APC framework 120. The control unit 121 may also control the overall operations of one or more of the process tools 105.

In the illustrated embodiment the process tools 105 are coupled to respective sensors 115 (shown as sensors 115(1-n) in FIG. 1). The sensors 115 measure additional operational data that may not be ascertained by the associated process tool 105 itself. For example, the sensors 115 may be used to determine a temperature range or other environmental or ambient data near or around the associated process tool 105. In alternative embodiments, the sensors 115 may be used to sense various other operational parameters, and, thus, need not be limited to the aforementioned examples.

The sensor 115 may be embodied as a simple data acquisition program, such as a C++ standalone program acquiring data from a thermocouple wire, for example. Alternatively, the sensor 115 may be embodied as a full-fledged LABVIEW application, acquiring data through multiple transducers (not shown). It will further be appreciated that the sensor 115 need not be used at all, and the APC framework 120 may rely upon the operational data forwarded from the equipment interface 110. If used, in one embodiment, the sensor 115 forwards the additional operational data to the APC framework 120 for analysis.

The system 100 includes a tool monitor 122 having a control unit 123 and a storage unit 124. The tool monitor 122 receives data from one or more of the process tools 105, the sensors 115, and the metrology tool 107 and determines if a degraded condition is suspected in one or more of the process tools 105. Prior to sending operational data to the tool monitor 122, the APC framework 120 may, in one embodiment, translate the operational data to a format that is recognizable by the tool monitor 122 in a manner that is well known to those of ordinary skill in the art. In an alternative embodiment, the tool monitor 122 may be integrated into the APC framework 120, and, as such, the translation of the operational data to a format that is recognizable by the tool monitor 122 may not be necessary.

A degraded condition may be identified in one of a variety of ways. For example, in one embodiment, the tool monitor 122 may determine that a fault may be present with a process tool 105 based on the metrology data provided by the metrology tool 107. If the received metrology data, such as measured critical dimensions, is not within an acceptable operational range, for instance, the tool monitor 122 may signal a degraded condition. In an alternative embodiment, as is described below in more detail, the tool monitor 122 may identify the degraded condition based on the operational data that is provided by the process tools 105 or the sensors 115. For example, the tool monitor 122 may monitor a tool state variable, such as chamber pressure, during the operation of the process tool 105. If the operational variable exceeds a predetermined threshold, the tool monitor 122 may identify a degraded condition.

The tool monitor 122, in the illustrated embodiment, may employ a database 155 including classification data regarding the sources of potential degraded conditions. In one embodiment, a single error signal may be used by the tool monitor 122 to detect a degraded condition. In another embodiment, the error signal may represent a combination error signal that indicates that the degraded condition represented by the error signal may have been caused by a combination of two or more process tools 105. That is, while each process tool 105, when considered individually, may have produced a lot of wafers within an acceptable range, the process tools 105, when operating collectively on the lot of wafers, produce the degraded condition. For example, if a lot is at a polysilicon final etch inspection, and the measured critical dimensions are smaller than desired, then this degraded condition may be attributed to a variety of process tools 105 that may have processed that lot earlier. As such, the degraded condition may be associated with a deposition tool that initially laid the polysilicon, an etching tool that performed the polysilicon etch step, or a photolithography tool that laid the photoresist pattern used to etch the polysilicon.

The tool monitor 122 may access the database 155 based on the error signal received. The tool monitor 122 may retrieve the classification information that is stored in the database 155 that is related to the degraded condition that is identified by the received error signal. The tool monitor 122 analyzes the accessed classification information to determine the possible causes of the fault In instances where a collective effort of the process tools 105 may have resulted in the fault, the database 155 may reflect that various process tools 105 may have contributed to the fault.

At this point the tool monitor 122 may not be certain whether the degraded condition is actually a fault. For example, the tool monitor 122 may not have sufficient data to determine whether a fault condition exists. Upon identification of a degraded condition, the tool monitor 122 enables tool trace data collection for the potentially affected process tool 105. If the cause of the degraded condition is not clear, such as with the polysilicon example described above, the tool monitor 122 may enable tool trace data collection for more than one of the process tools 105 (e.g., the deposition tool, the etch tool, and the photolithography tool).

The tool trace data may or may not include the particular operational data used to initially identify the degraded condition. For example, while the chamber pressure data may be used to identify a degraded condition for an etch tool, the complete set of tool trace data may include gas flow, chamber pressure, chamber temperature, voltage, reflected power, backside helium pressure, RF tuning parameters, etc.

The subsequently collected tool trace data allows more detailed fault analysis and/or tool heath analysis to be conducted. The trace data may be subsequently used to detect fault conditions with the process tool, diagnose a potential problem, or dismiss the degraded condition. The tool trace data may be evaluated by operation or engineering personnel to troubleshoot or confirm the potential fault condition. The tool trace data may then be analyzed using more detailed fault detection techniques, such as a tool health analysis. For example, a commercially available software package, such as ModelWare, that provides fault detection analysis of the process tools 105 may be used. It will be appreciated, however, that other types of commercially available fault detection software may also be used in lieu thereof without departing from the spirit and scope of the present invention. The tool trace data may continue indefinitely (i.e., until operator intervention) or for a predetermined time interval (e.g., predetermined number of processing runs, shifts, or days).

It should be appreciated that the illustrated components shown in the block diagram of the system 100 in FIG. 1 are illustrative only, and that, in alternative embodiments, additional or fewer components may be utilized without deviating from the spirit or scope of the invention. For example, in one embodiment, the one or more of the process tools 105 may not have an associated sensor 115. Additionally, it should be noted that although various components, such as the equipment interface 110 of the system 100 of FIG. 1 are shown as stand-alone components, in alternative embodiments, such components may be integrated into the process tool 105. Similarly, the tool monitor 122 may be integrated into the APC framework 120. In one embodiment, the metrology tool 107 may communicate with the APC framework 120 without an associated intervening equipment interface 108.

Figure 2:
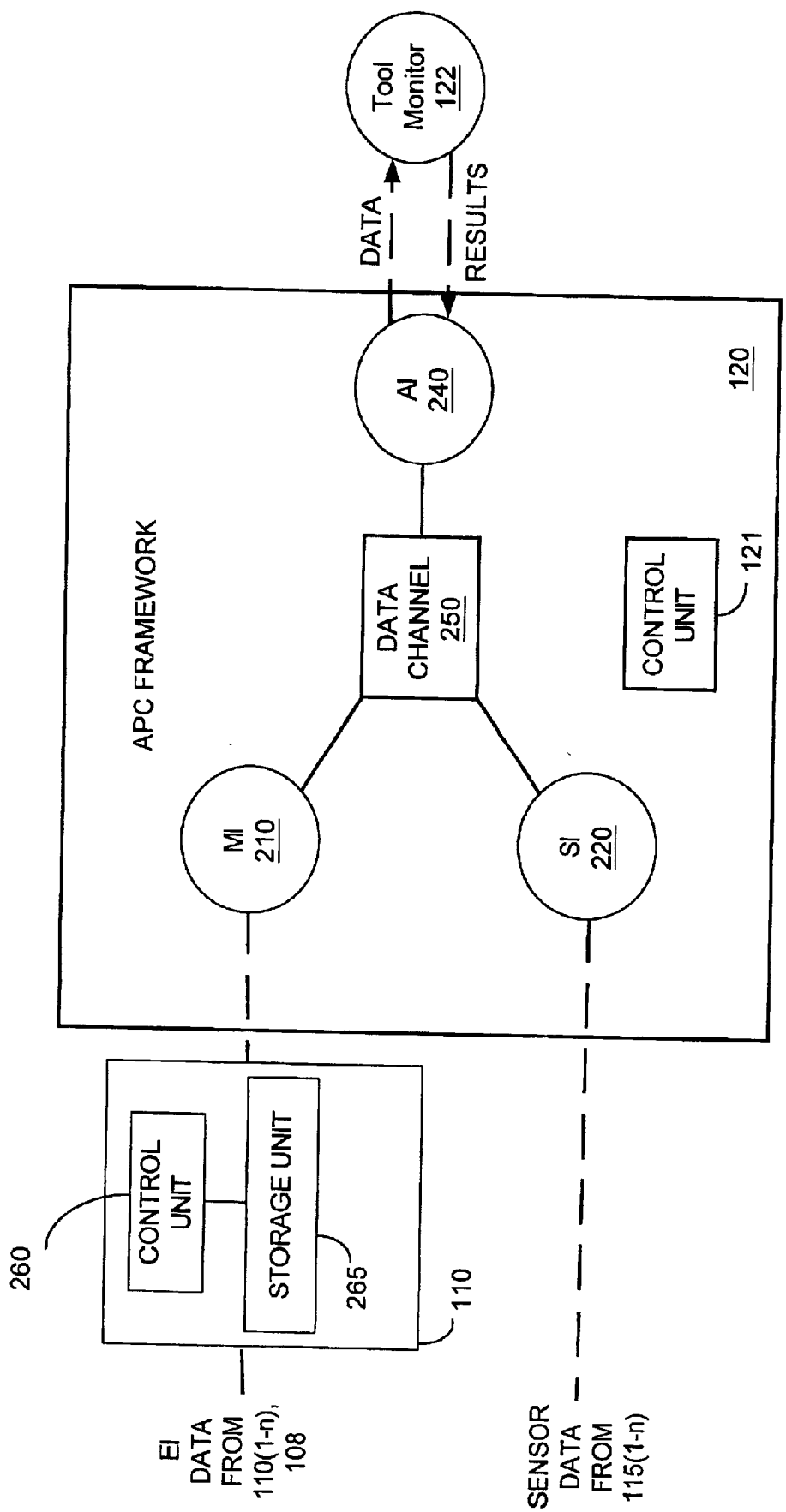
FIG. 2 depicts a simplified block diagram of the APC framework of FIG. 1.

Turning now to FIG. 2, a more detailed representation of the APC framework 120 is provided. The APC framework 120 is a component-based architecture comprised of interchangeable, standardized software components enabling run-to-run control and fault detection of the process tools 105. The APC framework 120 includes a machine interface (MI) 210 for communication with the process tool 105 and the APC framework 120 to collect operational data therefrom. The APC framework 120 further includes a sensor interface (SI) 220 for communication between the sensor 115 and the APC framework 120. The sensor interface 220 also collects operational data of the process tool 105 through the sensor 115. The APC framework 120 further includes an applications interface (AI) 240 for interfacing with third-party applications that run on the tool monitor 122 to analyze the operational data received via the machine and sensor interfaces 210, 220. In the illustrated embodiment, a third-party application may be the tool monitor 122. A data channel 250 is further provided to allow for communication of data from the machine and sensor interfaces 210, 220 and the applications interface 240 of the APC framework 120.

The machine interface (MI) 210 couples to the equipment interface 110 to serve as an interface between the process tool 105 and the APC framework 120. The machine interface 210 supports the setup, activation, monitoring, and data collection of the process tool 105. The machine interface 210 receives commands, status events, and collected data from the equipment interface 110 and forwards this information to other components of the APC framework 120, namely the applications interface 240. Any responses that are received by the machine interface 210 from the other components of the APC framework 120 are routed to the equipment interface 110 for delivery to the process tool 105. As previously discussed, this may include a control signal from the tool monitor 122 (see FIG. 1) to enable the sensors 115 if tool trace data collection is initiated. The tool monitor 122 may also notify the equipment interface 110 to collect the additional operational data required to generate the tool trace.

The machine interface 210 may reformat and restructure the messages between the specific communications protocol utilized by the equipment interface 110 and the Common Object Request Broker Architecture Interface Definition Language (CORBA IDL) communications protocol used by the components of the APC framework 120. The manner in which the machine interface 210 performs such translation between the equipment interface-specific communications protocol and the CORBA IDL protocol of the APC framework 120 is well known to those of ordinary skill in the art. Accordingly, the specific translation process between these two formats will not be discussed herein to avoid unnecessarily obscuring the present invention.

FIG. 2 illustrates one embodiment of the equipment interface 10 that communicates with the machine interface 210 of the APC framework 120. The equipment interface 110 includes a control unit 260 that is communicatively coupled to a storage unit 265.

The sensor interface 220 is coupled to the sensor 115 and serves as an interface between the sensor 115 and the APC framework 120. The sensor interface 220 provides setup, activation, monitoring, and data collection for the sensor 115. Similar to the machine interface 210, the sensor interface 220 may also reformat and restructure the messages between the specific communications protocol utilized by the sensor 115 and the CORBA IDL protocol used by the components of the APC framework 120.

The applications interface 240 supports the integration of third-party tools (e.g., commercial software packages, such as ModelWare, MatLab, and Mathematica, for example) to the APC framework 120. Typically, these third-party tools do not provide the standard CORBA IDL protocol known to the APC framework 120; accordingly, the applications interface 240 provides the necessary translation between the communications protocol utilized by the third-party tool and the CORBA protocol used by the APC framework 120.

Figure 3:
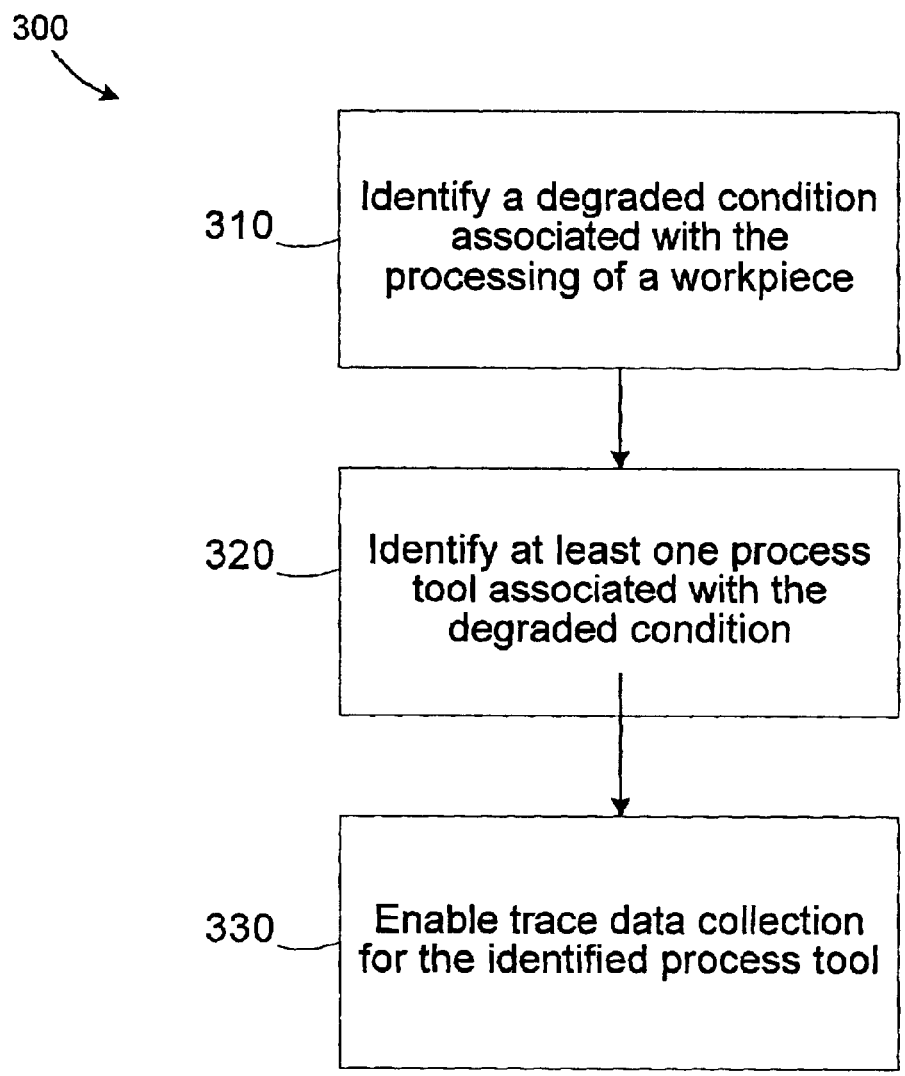
FIG. 3 illustrates a simplified flow diagram of a method that may be implemented in the manufacturing system of FIG. 1, in accordance with another illustrative embodiment of the present invention.

Referring now to FIG. 3, a flow diagram of a method that may be implemented in the manufacturing system 100 of FIG. 1 is illustrated, in accordance with one embodiment of the present invention. In block 310, a degraded condition associated with the processing of a workpiece is identified (i.e., by the tool monitor 122). Identifying the degraded condition (at 310), in one embodiment, may include comparing the operational data (related to the processed workpiece) received from the process tools 105 or sensors 115 to model data or a predetermined threshold. In an alternative embodiment, detecting the degraded condition (at 310) may include determining whether the metrology data (based on the processed workpiece) that is provided by the metrology tool 107 is within acceptable operational parameters. In block 320, the tool monitor 122 identifies at least one process tool 105 associated with the degraded condition. The tool monitor 122 may use a compilation of information associated with the processing of the lot of wafers, where the information may, for example, include information related to the route that the workpiece took during processing. The tool monitor 122 may use the database 155 to identify potential sources for the degraded condition. The tool monitor 122, in some circumstances, may also identify more than one process tool 105 associated with the degraded condition. In block 330, the tool monitor 122 enables trace data collection for the identified process tool 105. Enabling the trace data collection may entail enabling the collection of operational data from the process tool 105 and/or environmental data associated with the process tool 105. The trace data may be subsequently used to detect fault conditions with the process tool, diagnosing a potential problem, or dismissing the degraded condition.

The various system layers, routines, or modules described herein may be executable by the control units 121, 123 (see FIG. 1), 260 (see FIG. 2). As utilized herein, the term "control unit" may include a microprocessor, a microcontroller, a digital signal processor, a processor card (including one or more microprocessors or controllers), or other control or computing devices. The storage unit 124 (see FIG. 1) referred to in this discussion may include one or more machine-readable storage media for storing data and instructions. The storage media may include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy, removable disks; other magnetic media including tape; and optical media such as compact disks (CDs) or digital video disks (DVDs). Instructions that make up the various software layers, routines, or modules in the various systems may be stored in respective storage devices. The instructions when executed by a respective control unit cause the corresponding system to perform programmed acts.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   identifing a degraded condition associated with the processing of a workpiece;
   identifying at least one process tool associated with the degraded condition; and enabling trace data collection for the identified process tool.

2. The method of claim 1, further comprising:

identifying a plurality of process tools associated with the degraded condition; and enabling trace data collection for at least a subset of the identified process tools.

3. The method of claim 1, further comprising terminating the trace data collection after a predetermined time interval.

4. The method of claim 1, further comprising:

collecting trace data responsive to the enabling; and analyzing the trace data to identify a fault condition associated with the process tool.

5. The method of claim 1, wherein enabling the trace data collection further comprises enabling the collection of operational data associated with the identified process tool.

6. The method of claim 1, wherein enabling the trace data collection further comprises enabling the collection of environmental data associated with the identified process tool.

7. The method of claim 1, wherein enabling the trace data collection further comprises enabling an external sensor associated with the identified process tool.

8. The method of claim 1, wherein identifying the degraded condition further comprises:

receiving metrology data associated with the workpiece; and determining if the metrology data is within a predetermined range.

9. The method of claim 1, wherein identifying the degraded condition further comprises:

receiving operational data associated with the process tool; and determining if the operational data is within a predetermined range.

10. The method of claim 1, wherein identifing the degraded condition further comprises:

receiving metrology data associated with the workpiece, the metrology data including a measured characteristic of the workpiece;

determining that the measured characteristic is outside a predetermined range; and identifying a plurality of process tools associated with the processing of the workpiece having a potential to impact the measured characteristic.

11. The method of claim 10, further comprising enabling trace data collection for at least a subset of the plurality of process tools.

12. The method of claim 2, further comprising:

accessing information related to the degraded condition from a database; and identifying the plurality of process tools associated with the degraded condition based on the accessed information.

13. An article comprising one or more machine-readable storage media containing instructions that when executed enable a processor to:

identify a degraded condition associated with the processing of a workpiece;

identify at least one process tool associated with the degraded condition; and enable trace data collection for the identified process tool.

14. The article of claim 13, wherein the instructions when executed enable the processor to identify a plurality of process tools associated with the degraded condition and to enable trace data collection for at least a subset of the identified process tools.

15. The article of claim 13, wherein the instructions when executed enable the processor to terminate the trace data collection after a predetermined time interval.

16. The article of claim 13, wherein the instructions when executed enable the processor to collect trace data responsive to the enabling and analyze the trace data to identify a fault condition associated with the process tool.

17. The article of claim 13, wherein the instructions when executed enable the processor to enable the collection of operational data associated with the identified process tool.

18. The article of claim 13, wherein the instructions when executed enable the processor to enable the collection of environmental data associated with the identified process tool.

19. The article of claim 13, wherein the instructions when executed enable the processor to enable an external sensor associated with the identified process tool.

20. The article of claim 13, wherein the instructions when executed enable the processor to receive metrology data associated with the workpiece and determine if the metrology data is within a predetermined range.

21. The article of claim 13, wherein the instructions when executed enable the processor to receive operational data associated with the process tool and determine if the operational data is within a predetermined range.

22. The article of claim 13, wherein the instructions when executed enable the processor to receive metrology data associated with the workpiece, the metrology data including a measured characteristic of the workpiece, determine that the measured characteristic is outside a predetermined range, and identify a plurality of process tools associated with the processing of the workpiece having a potential to impact the measured characteristic.

23. The article of claim 22, wherein the instructions when executed enable the processor to enable trace data collection for at least a subset of the plurality of process tools.

24. The article of claim 14, wherein the instructions when executed enable the processor to access information related to the degraded condition from a database and identify the plurality of process tools associated with the degraded condition based on the accessed information.

25. A system, comprising:

a processing system configured to process a workpiece; and a tool monitor configured to identify a degraded condition associated with the processing of the workpiece, identify at least one process tool from the processing system associated with the degraded condition, and enable trace data collection for the identified process tool.

26. The system of claim 25, wherein the tool monitor is further configured to identify a plurality of process tools from the processing system associated with the degraded condition and enable trace data collection for at least a subset of the identified process tools.

27. The system of claim 25, wherein the tool monitor is further configured to terminate the trace data collection after a predetermined time interval.

28. The system of claim 25, wherein the tool monitor is further configured to collect trace data responsive to the enabling and analyze the trace data to identify a fault condition associated with the identified process tool.

29. The method of claim 25, wherein the tool monitor is further configured to enable the collection of operational data associated with the identified process tool.

30. The system of claim 25, wherein the tool monitor is further configured to enable the collection of environmental data associated with the identified process tool.

31. The system of claim 25, wherein the tool monitor is further configured to enable an external sensor associated with the identified process tool.

32. The system of claim 25, further comprising a metrology tool configured to generate metrology data associated with at least one characteristic of the workpiece, wherein the tool monitor is further configured to receive the metrology data and determine if the metrology data is within a predetermined range.

33. The system of claim 25, wherein the tool monitor is further configured to receive operational data associated with the identified process tool and determine if the operational data is within a predetermined range.

34. The system of claim 25, further comprising a metrology tool configured to generate metrology data associated with at least one characteristic of the workpiece, wherein the tool monitor is further configured to receive the metrology data, determine that the characteristic is outside a predetermined range, and identify a plurality of process tools associated with the processing of the workpiece having a potential to impact the characteristic.

35. The system of claim 34, wherein the tool monitor is further configured to enable trace data collection for at least a subset of the plurality of process tools.

36. The system of claim 26, wherein the tool monitor is further configured to access information related to the degraded condition from a database and identify the plurality of process tools associated with the degraded condition based on the accessed information.

37. A system, comprising:
   means for identifying a degraded condition associated with the processing of a workpiece;
   means for identifying at least one process tool associated with the degraded condition; and
   means for enabling trace data collection for the identified process tool.

* * * * *